US009665122B2

(12) United States Patent
Kwon et al.

(10) Patent No.: US 9,665,122 B2
(45) Date of Patent: May 30, 2017

(54) SEMICONDUCTOR DEVICE HAVING MARKINGS AND PACKAGE ON PACKAGE INCLUDING THE SAME

(71) Applicants: Heung Kyu Kwon, Seongnam-si (KR); Hae Gu Lee, Asan-si (KR); Byeong Yeon Cho, Suwon-si (KR)

(72) Inventors: Heung Kyu Kwon, Seongnam-si (KR); Hae Gu Lee, Asan-si (KR); Byeong Yeon Cho, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/845,573

(22) Filed: Sep. 4, 2015

(65) Prior Publication Data
US 2016/0099205 A1 Apr. 7, 2016

(30) Foreign Application Priority Data

Oct. 6, 2014 (KR) ........................ 10-2014-0134292

(51) Int. Cl.
H01L 23/48 (2006.01)
G06F 1/16 (2006.01)
(Continued)

(52) U.S. Cl.
CPC ............. *G06F 1/1601* (2013.01); *G06F 1/16* (2013.01); *H01L 23/49816* (2013.01); *H01L 23/5389* (2013.01); *H01L 23/544* (2013.01); *H01L 24/97* (2013.01); *H01L 25/105* (2013.01); *H01L 25/50* (2013.01); *H01L 21/561* (2013.01); *H01L 23/3128* (2013.01); *H01L 24/16* (2013.01);
(Continued)

(58) Field of Classification Search
CPC ............................. H01L 23/498; H01L 21/50
See application file for complete search history.

(56) References Cited

U.S. PATENT DOCUMENTS 6,121,070 A * 9/2000 Akram ..................... H01L 23/50
257/E21.506
6,472,762 B1 * 10/2002 Kutlu ....................... H01L 23/36
257/706
(Continued)

FOREIGN PATENT DOCUMENTS

KR 20130071792 7/2013
KR 20140029826 A 3/2014
KR 20140081692 A 7/2014

OTHER PUBLICATIONS

"Hybrid FCFBGA with Over Mold/MUF" Signetics.
Galloway, Jesse, "Lidded Versus Bare Die Flip Chip Package: Impact on thermal Performance".

*Primary Examiner* — Caleb Henry
(74) *Attorney, Agent, or Firm* — Volentine & Whitt, PLLC

(57) ABSTRACT

A semiconductor package includes a printed circuit board (PCB), a chip bonded to the PCB, a mold protecting the chip and exposing a backside surface of the chip, via openings extending in the mold to expose first contacts bonded to the PCB, and at least one first marking inscribed in a marking region of the mold between the backside surface of the chip and the vias. The mold has an exposed molded underfill (eMUF) structure covering the sides of the chip while exposing the backside surface of the chip. A PoP package includes a top package stacked on and electrically connected to the semiconductor package.

20 Claims, 9 Drawing Sheets

(51) Int. Cl.

| | |
|---|---|
| *H01L 23/498* | (2006.01) |
| *H01L 23/544* | (2006.01) |
| *H01L 23/00* | (2006.01) |
| *H01L 25/10* | (2006.01) |
| *H01L 25/00* | (2006.01) |
| *H01L 23/538* | (2006.01) |
| *H01L 23/31* | (2006.01) |
| *H01L 21/56* | (2006.01) |
| *H05K 1/02* | (2006.01) |
| *H05K 3/34* | (2006.01) |

(52) U.S. Cl.
CPC ........... *H01L 2223/54406* (2013.01); *H01L 2223/54426* (2013.01); *H01L 2223/54433* (2013.01); *H01L 2223/54486* (2013.01); *H01L 2224/16227* (2013.01); *H01L 2224/97* (2013.01); *H01L 2225/1023* (2013.01); *H01L 2225/1058* (2013.01); *H01L 2924/14* (2013.01); *H01L 2924/15311* (2013.01); *H01L 2924/15321* (2013.01); *H01L 2924/15331* (2013.01); *H01L 2924/1815* (2013.01); *H01L 2924/18161* (2013.01); *H05K 1/0269* (2013.01); *H05K 3/3436* (2013.01); *H05K 2201/10159* (2013.01); *H05K 2201/10515* (2013.01); *H05K 2201/10734* (2013.01); *H05K 2201/10977* (2013.01)

(56) References Cited

U.S. PATENT DOCUMENTS

| | | | | |
|---|---|---|---|---|
| 6,667,556 | B2* | 12/2003 | Moden | H01L 21/563 257/778 |
| 6,916,686 | B2* | 7/2005 | Wada | H01L 23/3128 257/E23.13 |
| 7,129,584 | B2* | 10/2006 | Lee | H01L 23/4985 174/260 |
| 7,180,165 | B2* | 2/2007 | Ellsberry | H01L 23/49816 257/685 |
| 7,195,935 | B2* | 3/2007 | Shiozawa | H01L 22/20 257/E21.525 |
| 7,400,032 | B2* | 7/2008 | Corisis | H01L 23/4985 257/673 |
| 7,452,732 | B2* | 11/2008 | Corbett | B23K 26/0823 257/E23.179 |
| 7,749,887 | B2* | 7/2010 | Lee | H01L 21/4846 257/E21.506 |
| 7,880,308 | B2* | 2/2011 | Yoshimura | H01L 23/49827 257/775 |
| 8,030,761 | B2 | 10/2011 | Kolan et al. | |
| 8,183,675 | B2 | 5/2012 | Chow et al. | |
| 8,273,607 | B2 | 9/2012 | Park et al. | |
| 8,288,205 | B2* | 10/2012 | Shim | 438/109 |
| 8,466,544 | B2* | 6/2013 | Pagaila | H01L 21/486 257/686 |
| 8,519,524 | B1* | 8/2013 | Wu | H01L 25/0652 174/256 |
| 8,624,374 | B2* | 1/2014 | Ding | H01L 21/6835 257/686 |
| 8,685,797 | B2 | 4/2014 | Park et al. | |
| 8,748,233 | B2 | 6/2014 | Choi et al. | |
| 9,355,997 | B2* | 5/2016 | Katkar | H01L 21/561 |
| 2001/0054771 | A1* | 12/2001 | Wark | G01R 1/06738 257/786 |
| 2004/0238948 | A1* | 12/2004 | Shiozawa | H01L 23/3114 257/723 |
| 2006/0076671 | A1* | 4/2006 | Kariya | H01L 23/49811 257/702 |
| 2008/0258287 | A1* | 10/2008 | Kasuga | H01L 23/544 257/686 |
| 2009/0102070 | A1* | 4/2009 | Feger | H01L 21/563 257/797 |
| 2010/0003786 | A1* | 1/2010 | Feger | H01L 21/563 438/113 |
| 2010/0140771 | A1* | 6/2010 | Huang | H01L 23/49833 257/686 |
| 2011/0278717 | A1* | 11/2011 | Pagaila | H01L 21/568 257/737 |
| 2012/0021564 | A1* | 1/2012 | Chen | H01L 24/92 438/108 |
| 2012/0056329 | A1* | 3/2012 | Pagaila | H01L 21/56 257/774 |
| 2012/0061824 | A1* | 3/2012 | Pagaila | H01L 21/568 257/737 |
| 2012/0146177 | A1* | 6/2012 | Choi | H01L 25/16 257/528 |
| 2012/0168970 | A1* | 7/2012 | Sato | H01L 24/29 257/797 |
| 2012/0187562 | A1* | 7/2012 | Hisada | H01L 23/49811 257/738 |
| 2012/0241915 | A1* | 9/2012 | Bathan | H01L 21/561 257/621 |
| 2012/0322206 | A1* | 12/2012 | Tabrizi | H01L 23/055 438/108 |
| 2013/0062757 | A1* | 3/2013 | Feger | H01L 23/544 257/737 |
| 2013/0115735 | A1 | 5/2013 | Chen et al. | |
| 2013/0134583 | A1* | 5/2013 | Tsukiyama | H01L 23/49811 257/737 |
| 2013/0161800 | A1 | 6/2013 | Byun et al. | |
| 2013/0270700 | A1 | 10/2013 | Yu et al. | |
| 2014/0041918 | A1* | 2/2014 | Shen | H05K 3/4015 174/261 |
| 2014/0070396 | A1* | 3/2014 | Kyozuka | H01L 24/19 257/698 |
| 2014/0084487 | A1* | 3/2014 | Zhao | H01L 25/105 257/777 |
| 2014/0091455 | A1 | 4/2014 | Strothmann et al. | |
| 2014/0124916 | A1* | 5/2014 | Yu | H01L 25/105 257/737 |
| 2014/0183746 | A1* | 7/2014 | Lin | H01L 24/83 257/772 |
| 2014/0300001 | A1* | 10/2014 | Choi | H05K 1/112 257/774 |
| 2014/0346516 | A1* | 11/2014 | Lee | G11O 5/025 257/48 |
| 2014/0374922 | A1* | 12/2014 | Huang | H01L 23/3128 257/777 |
| 2015/0348912 | A1* | 12/2015 | Su | H01L 23/544 257/666 |
| 2015/0357317 | A1* | 12/2015 | Chen | H01L 21/31144 257/737 |
| 2016/0013138 | A1* | 1/2016 | Chen | H01L 21/768 257/774 |
| 2016/0095209 | A1* | 3/2016 | Starkston | H05K 1/0271 361/767 |
| 2016/0172287 | A1* | 6/2016 | Arisaka | H05K 1/11 257/774 |

\* cited by examiner

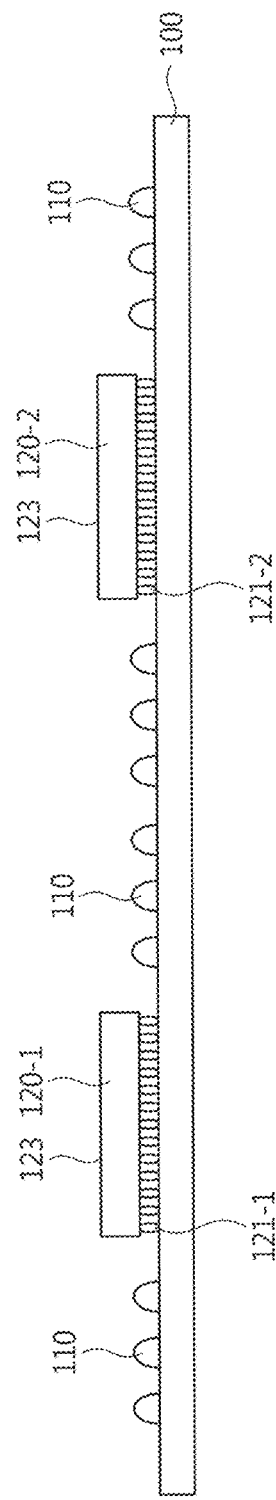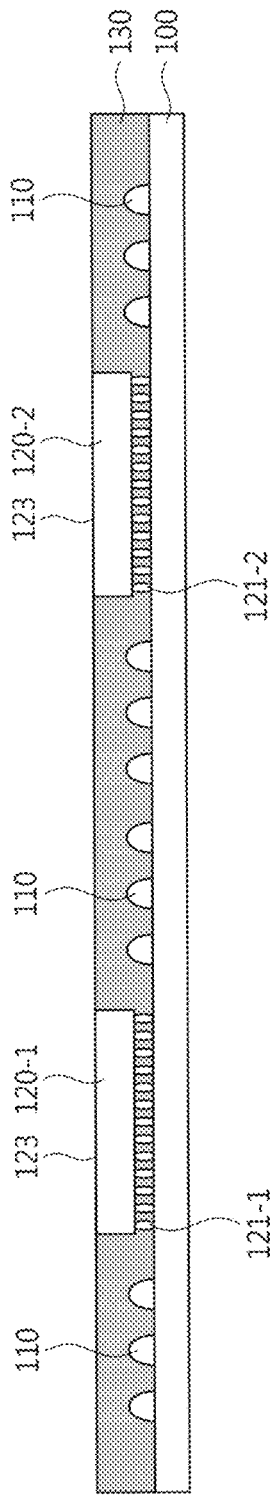

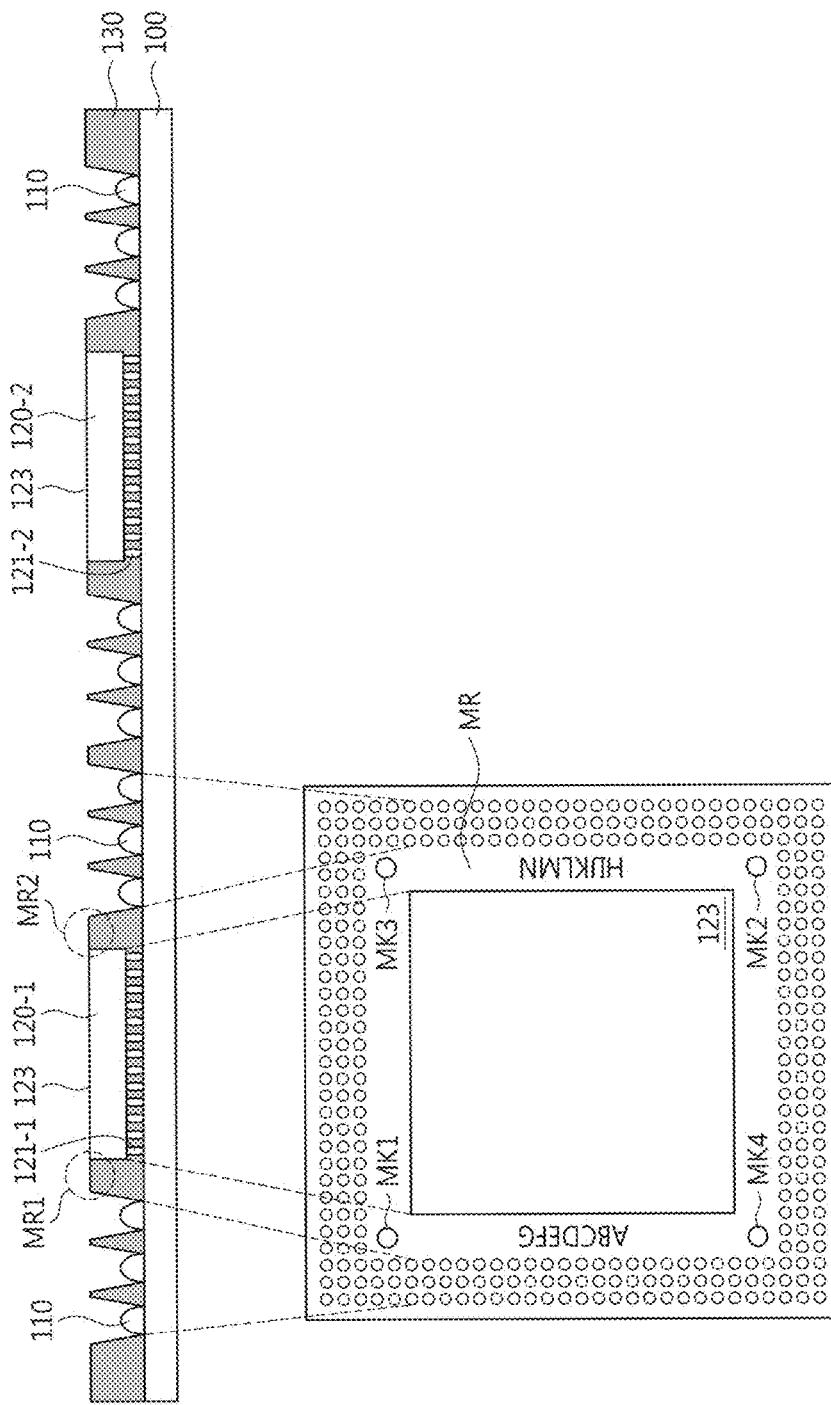

SEMICONDUCTOR DEVICE HAVING MARKINGS AND PACKAGE ON PACKAGE INCLUDING THE SAME

PRIORITY STATEMENT

This application claims priority under 35 U.S.C. §119(a) from Korean Patent Application No. 10-2014-0134292 filed on Oct. 6, 2014, the disclosure of which is hereby incorporated by reference in its entirety.

BACKGROUND

The inventive concept relates to semiconductor device packages having markings that provide information about the package such as manufacturer and product information, e.g., model name and/or number. The inventive concept relates to multi-chip packages in which at least one chip is stacked on another chip or die, such as a package on package (PoP).

A surface of a semiconductor chip is typically inscribed with markings that identify or otherwise distinguish the semiconductor chip. Generally, the markings include the model of the chip or package in which the chip is carried, the manufacturer's logo, production date, and lot ID. However, in certain types of packages including a chip mounted on a substrate, such as a package on package (PoP), molding material is spread or diffused on the surface of the chip during a process of molding the chip to the substrate. In this case, the markings may be obscured by the molding material.

SUMMARY

According to the inventive concept, there is provided an embodiment of a semiconductor device package including a printed circuit board (PCB) having an upper surface, a chip bonded to the PCB and having an active surface facing the upper surface of the PCB and a backside surface facing away from the upper surface of the PCB, first contacts bonded to the PCB at the upper surface of the PCB, a mold molded to the PCB at the upper surface thereof, protecting sides of the chip and exposing the backside surface of the chip, and having via openings exposing the first contacts bonded to the PCB, and at least one first marking inscribed in a marking region of the mold, and in which the marking region is located between the backside surface of the chip and the via openings.

According to the inventive concept, there is provided an embodiment of a package on package (PoP) including a bottom semiconductor package, a top semiconductor package stacked on the bottom semiconductor package, and contacts electrically connecting the top and bottom packages, and in which the bottom semiconductor package includes a printed circuit board (PCB) having an upper surface, a chip bonded to the PCB and having an active surface facing the upper surface of the PCB and a backside surface facing away from the upper surface of the PCB, a mold molded to the PCB at the upper surface thereof, protecting sides of the chip and exposing the backside surface of the chip, and having via openings extending therein, and at least one first marking inscribed in a marking region of the mold located between the backside surface of the chip and the via openings, in which the top semiconductor package includes a substrate and a chip mounted to the substrate, and in which the electrical contacts are disposed in the via openings, respectively.

According to the inventive concept, there is provided an embodiment of a semiconductor device package including a bottom semiconductor package, a top semiconductor package stacked on the bottom semiconductor package, and contacts electrically connecting the PCB of the bottom semiconductor package and the top semiconductor package, and in which the bottom semiconductor package includes a printed circuit board (PCB) having an upper surface, a die disposed on the upper surface of the PCB and having an active surface facing the upper surface of the PCB, conductive bumps disposed on the upper surface of the PCB and electrically connecting the PCB to the die at the active surface of the die, a mold layer molded to the PCB at the upper surface of the PCB and having a top surface, via openings open at the top surface of the mold layer, and at least one first marking providing information about the PoP at a marking region of the top surface of the mold layer located in a region of the PoP between the outer periphery of the die and the via openings, in which the top semiconductor package includes a substrate and a chip mounted to the substrate, and in which the electrical contacts are disposed in the via openings, respectively.

According to the inventive concept, there is also provided an embodiment of a computing system including a board, a package on package (PoP) mounted to the board, and a display connected to the PoP through the board and comprising a bottom semiconductor package, a top stacked on the bottom semiconductor package, and electrical contacts electrically connecting the bottom semiconductor package and the top semiconductor package, and in which the bottom semiconductor package includes a printed circuit board (PCB) having an upper surface, a chip bonded to the PCB and having an active surface facing the upper surface of the PCB and a backside surface facing away from the PCB, a mold molded to the PCB at the upper surface thereof, protecting sides of the chip, exposing the backside surface of the chip, and having via openings extending therein and at least one first marking inscribed in a marking located between the backside surface of the chip and the via openings, in which the top semiconductor package includes a substrate and a chip mounted to the substrate, and the electrical contacts are disposed in the via openings, respectively.

BRIEF DESCRIPTION OF THE DRAWINGS

The above and other features and advantages of the inventive concept will become more apparent from the following detailed description of preferred embodiments made with reference to the attached drawings in which:

FIGS. 1 through 9 together illustrate a semiconductor device package on package (PoP) during the course of its manufacture, according to the inventive concept, and in which FIGS. 1, 2 and 3A are each a sectional view of a semiconductor device constituting an intermediate product of the package, FIGS. 3B, 4 and 5 are each a plan view of an example of a chip of the semiconductor device, FIG. 6 is a sectional view of a semiconductor device constituting an intermediate product of the package, FIG. 7 is a sectional view of a semiconductor device bottom package of the PoP, and FIGS. 8 and 9 are each a sectional view of the PoP during a respective latter stage of its manufacture;

DETAILED DESCRIPTION OF THE PREFERRED EMBODIMENTS

Figure 4:
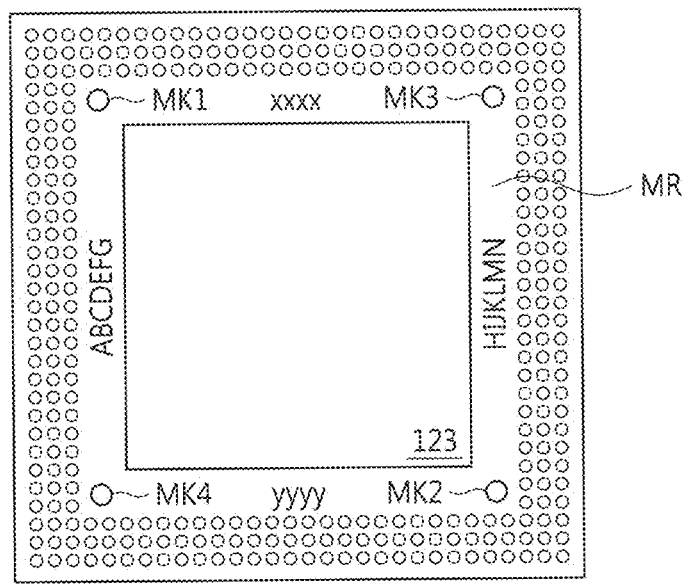

The inventive concept now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

A method of manufacturing a semiconductor package according to the inventive concept will now be described in detail with reference to FIGS. 1 through 9.

Referring first to FIG. 1, integrated circuits (ICs) 120-1 and 120-2 and first contacts 110 are bonded or attached to a top surface of a printed circuit board (PCB) 100. The first contacts 110 may be solder balls, solder bumps, or copper pads. The ICs 120-1 and 120-2 may be dies or chips. For purposes of description, the ICs 120-1 and 120-2 will be referred to hereinafter as chips. Each of the chips 120-1 and 120-2 may include at least one of a microprocessor, a graphics processor, a signal processor, a network processor, a chip set, an audio codec, an application processor (AP), and a system on chip (SoC).

The first chip 120-1 is bonded or attached to the top surface of the PCB 100 through bumps 121-1 using a flip-chip technique. The second chip 120-2 is also bonded or attached to the top surface of the PCB 100 through bumps 121-2 using a flip-chip technique. When the chips 120-1 and 120-2 are bonded to the top surface of the PCB 100 by the bumps 121-1 and 121-2, respectively, in a flip-chip manner, the active surfaces of the chips 120-1 and 120-2 to which the bumps 121-1 or 121-2 are bonded face the top surface of the PCB 100, and backside surfaces 123 of the chips are opposite the active surfaces.

The PCB 100 may include a plurality of metal layers isolated from each other by one or more dielectric layers. The metal layers may be connected to each other by conductive vias.

Referring to FIG. 2, a mold layer (referred to hereinafter as a "mold") 130 is formed on the PCB 100. The mold 130 may be an epoxy molding compound (EMC) to protect the chips 120-1 and 120-2 from external forces and conditions.

The mold 130 may have an exposed molded underfill (eMUF) structure. The eMUF structure of the mold 130 is that portion which wraps around the chips 120-1 and 120-2 completely so as to cover all of the sides of the chips 120-1 and 120-2, and exposes the backside surfaces 123 of the chips 120-1 and 120-2 only.

The distance from the PCB 100 to a top surface of the mold 130 may be substantially the same as the distance from the PCB 100 to the backside surfaces 123 of the chip 120-1 and 120-2.

Referring to FIG. 2 and FIG. 3A, via openings are formed in the mold 130 to expose the first contacts 110. The via openings may be formed using a laser, i.e., by a laser drilling process. The laser may be a $CO_2$ laser or a green laser but other known types of lasers may be used to conduct the laser drilling process.

Referring to FIG. 3B, at least one first marking ABCDEFG and/or HIJKLMN is inscribed on a marking region MR of the top surface of the mold 130. The at least one first marking ABCDEFG and/or HIJKLMN may be inscribe in the marking region MR using a laser. As shown in FIG. 3B, the marking region MR may include the region of the mold 130 surrounding the chip 120-1. For example, the marking region MR may include respective marking regions MR1 and MR2 on opposite sides the chip 120-1. The first marking ABCDEFG and HIJKLMN may also be inscribed in the marking region MR beside the second chip 120-2.

The via openings in the mold 130 and the at least one first marking ABCDEFG and/or HIJKLMN may be formed at the same time. That is, the via openings in the mold 130 and the at least one first marking ABCDEFG and/or HIJKLMN may be formed during the same stage of the manufacturing process which is a laser etching stage. During this stage, the via openings are formed by drilling into the mold 130 using a laser, i.e., the via openings are laser-drilled openings. Also, during this stage, the at least one first marking ABCDEFG and/or HIJKLMN is inscribed in the marking region MR1 and/or MR2 of the top surface of the mold 130, i.e., is/are laser-etched in the mold 130. The same laser used to form the via openings may be used to form the at least one first marking ABCDEFG and/or HIJKLMN.

In any case, the marking region MR1 and/or MR2 is located between the backside surface 123 of each chip 120-1 or 120-2 and the via openings that expose the first contacts 110 in the mold 130. As described above, the marking(s) may be inscribed simultaneously or in parallel with the laser drilling process. When the mold 130 has the eMUF structure, the marking region MR, e.g., regions MR1 and MR2, may be constituted by a surface of the eMUF structure. For example, the first marking ABCDEFG may be inscribed in the marking region MR1 of the eMUF structure on one side of the chip 120-1 or 120-2 and the first marking HIJKLMN may be inscribed in the marking region MR2 of the eMUF structure on the opposite side of the chip 120-1 or 120-2. Each of the first markings ABCDEFG and HIJKLMN may include information about a manufacturer of the chip 120-1 or 120-2 and product information (identifying the model and/or a characteristic) of the chip 120-1 or 120-2.

Recognition marks MK1 and MK2 may be inscribed in the marking region MR of each of the chips 120-1 and 120-2 to lie along a diagonal of the backside surface 123 in the case in which the backside surface 123 is a quadrilateral. At least one recognition mark MK3 and/or MK4 may also be inscribed in the marking region along the other diagonal of the backside surface 123 and may be located on an opposite end of the marking region MR1 or MR2 from the recognition mark MK1 and/or MK2. The recognition marks MK1 and MK2 (and MK3, MK4 as the case may be) are for used by a pattern recognition system (PRS). They may be used for aligning the chip during a subsequent manufacturing process. The recognition marks may be formed using ink. The first markings and the recognition marks maybe formed simultaneously or sequentially.

In the example illustrated in FIG. 4, first markings ABCDEFG, HIJKLMN, xxxx, and yyyy are inscribed on the marking region MR next to the four sides, respectively, of the backside surface 123. Also, in this example, at least two recognition marks MK1, MK2 (and MK3, MK4) may be formed on the marking region MR. At least two of the recognition marks, e.g., the two recognition marks MK1 and MK2 or the two recognition marks MK3 and MK4 are formed along a diagonal of the backside surface 123.

Figure 5:
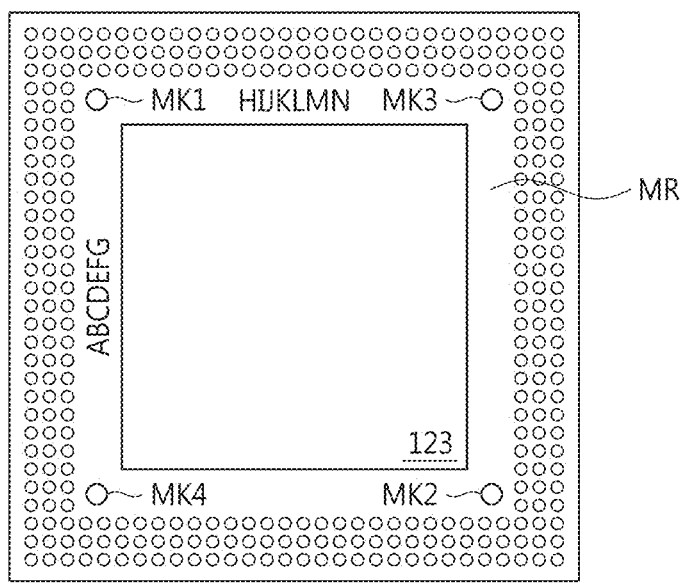

In the example shown in FIG. 5, the first markings ABCDEFG and HIJKLMN are formed on the marking region MR next to two intersecting ones of the four sides of the backside surface 123.

In the examples described above in which the backside surface 123 of each of the chips 120-1 and 120-2 is a polygon and in particular, a quadrilateral, it can be appreciated that a respective first marking may be formed in a marking region MR of the upper surface of the mold near each of at least one of the sides of the backside surface 123. FIGS. 3B and 5 show examples in which first markings are formed in the marking region adjacent only two of the sides of the backside surface 123, respectively, and FIG. 5 shows an example in which four first markings are formed in the marking region adjacent all (four) sides of the backside surface 123, respectively. However, in another example, a first marking is formed in the marking region adjacent one only of the four sides of the backside surface 124, and in still another example a respective first marking is formed in the marking region adjacent each of only three of the sides of the backside surface 123. In the examples in which more than one first marking is formed, the first markings will generally convey different product information from one another.

When two first markings are inscribed in the marking region near two opposite sides of the backside surface, respectively, the markings may spell out words or other information that read in the same direction or in opposite directions. Also, a second marking may be written on or inscribed in the backside surface 123 of each the chips 120-1 and 120-2. The function of the second marking may be similar to that of the first marking.

Figure 6:
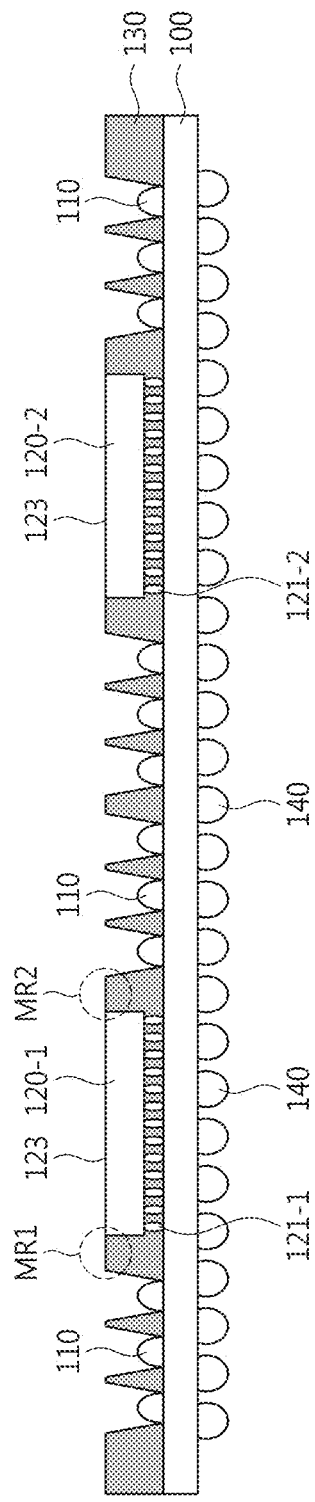
Figure 7:
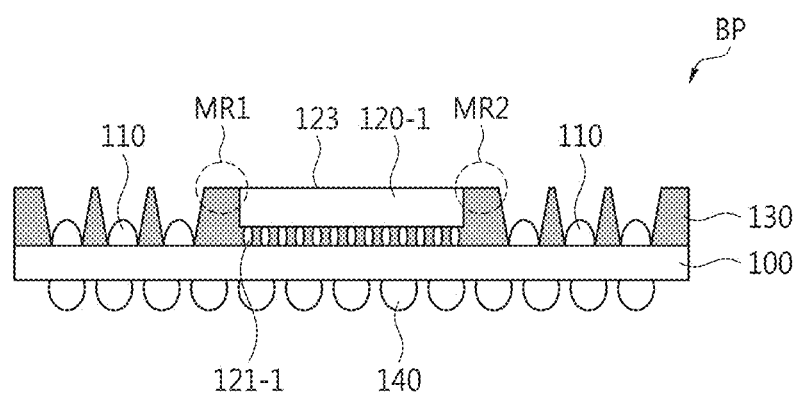

Referring now to FIG. 6, second contacts 140 are bonded to a bottom surface of the PCB 100. The second contacts 140 may be solder balls or bumps. Referring to FIGS. 6 and 7, the PCB 100 is sawed or cut to produce semiconductor bottom packages BP, one of which is shown in FIG. 7. Each semiconductor bottom package BP may have an eMUF structure. The chip 120-1 of the bottom package BP is tested in a test process.

Figure 8:
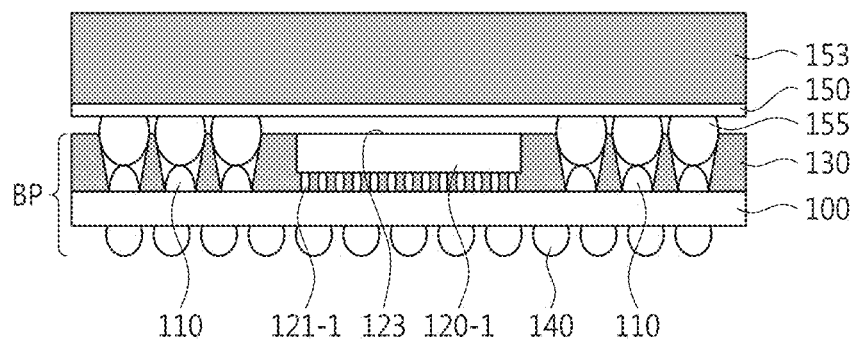

Referring to FIG. 8, contacts 155 of a semiconductor package 153, e.g., solder balls, are disposed in contact with the first contacts 110 of the semiconductor bottom package BP exposed through the via openings. For example, the semiconductor package 153 is stacked on the bottom package BP with the contacts 155 inserted into the via openings, respectively. The semiconductor package 153 also comprises a die, i.e., an IC and substrate 150, and passive elements connected to (the IC of) the die. The passive elements may include a resistor, an inductor, and/or a capacitor. Furthermore, the semiconductor package 153 may be a random access memory (RAM), dynamic RAM (DRAM), NAND flash memory including a controller, NOR flash memory, static RAM (SRAM), ferroelectric RAM (FRAM), phase-change RAM (PRAM), magnetoresistive RAM (MRAM), spin-transfer torque RAM (STT-RAM), or resistive RAM (RRAM).

Figure 9:
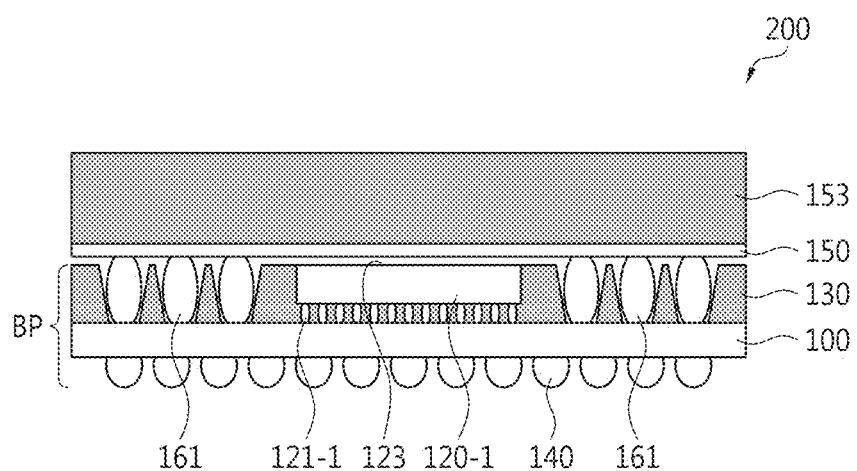

Referring to FIG. 9, the first contacts 110 of the semiconductor bottom package BP are physically and electrically connected to the contacts 155, respectively, of semiconductor package 153 using an infrared (IR) reflow process or other reflow or bonding process. In any case, contacts 161, e.g., vias that electrically connect the bottom package BP to the package 153 are formed in the mold 130.

That is, as a result, a PoP package 200 according to the inventive concept is formed.

Figure 10:
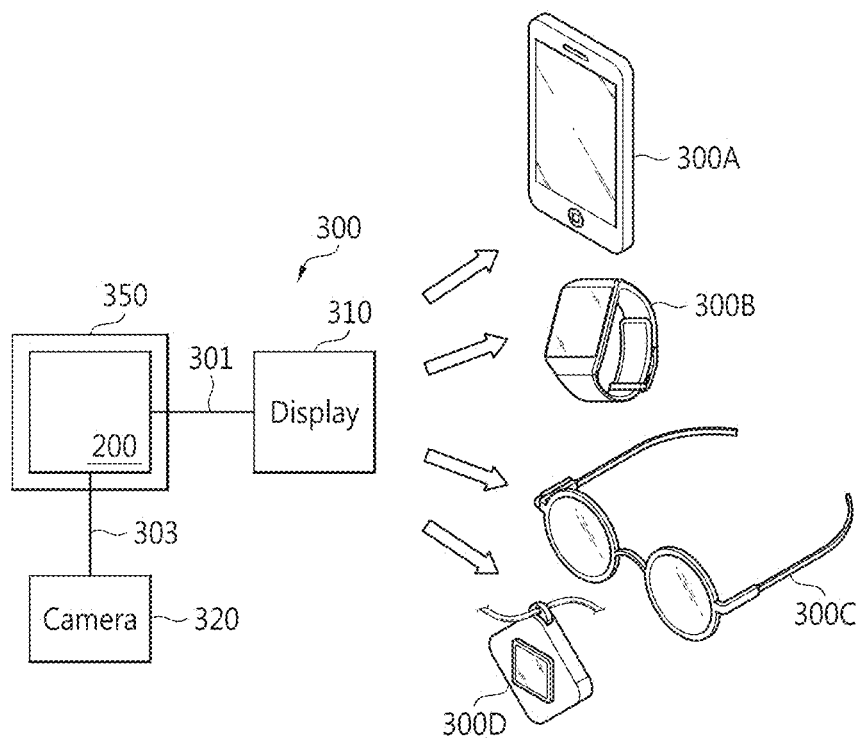
FIG. 10 is a conceptual diagram of an electronic system and various electronic products using the same, which include a semiconductor package according to the inventive concept.

FIG. 10 is a schematic diagram of a computing system 300 including a semiconductor package according to the inventive concept, and some of its applications. The computing system 300 includes PoP 200 attached to a motherboard or a system board 350 and a display 310. The computing system 300 may also include a camera 320.

The computing system 300 may be that of a cellular phone such as a smart phone 300A, a tablet (personal computer), a mobile internet device (MID), a wearable device, e.g., a smart watch 300B or pair of smart glasses 300C, a laptop computer, or an internet of things (IoT) device or an internet of everything (IoE) device 300D. The computing system 300 may also be that of a desktop computer, a workstation computer, or a server.

A display controller (not shown) of the chip 120-1 of the PoP 200 may transmit display data to the display 310 using a display serial interface (DSI) 301. The camera 320 may transmit image data to a camera interface (not shown) in the chip 120-1 of the PoP 200 using a camera serial interface (CSI) 303. The camera 320 may include a complementary metal-oxide semiconductor (CMOS) image sensor.

Figure 11:
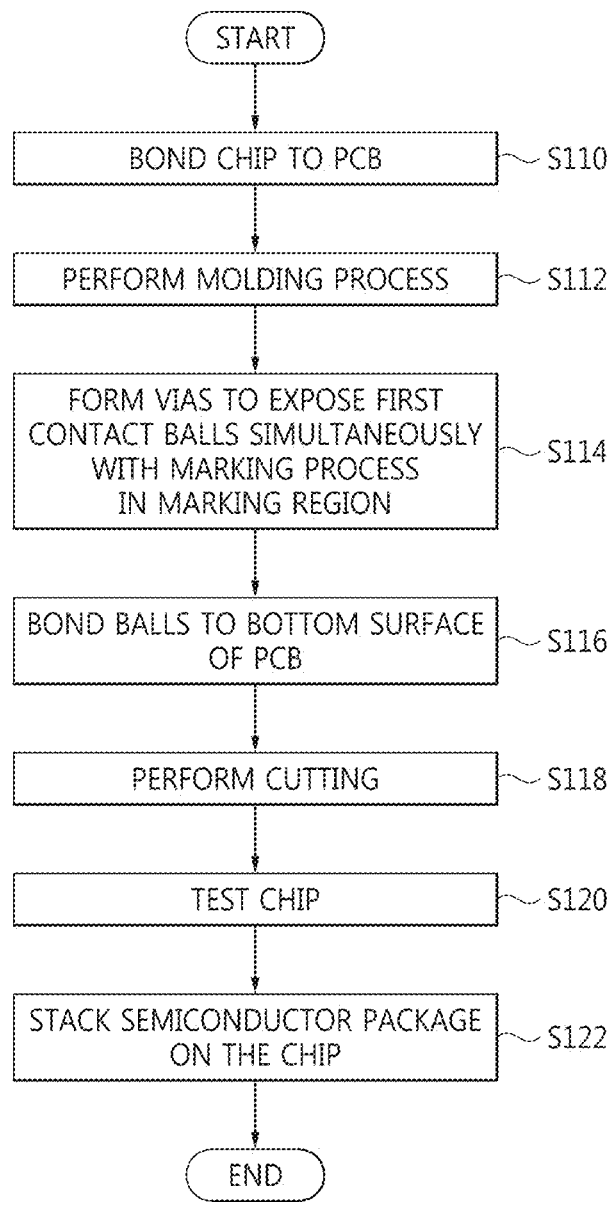
FIG. 11 is a flowchart of a method of manufacturing a semiconductor package according to the inventive concept.

FIG. 11 is a flowchart of an embodiment of a method of manufacturing a semiconductor package according to the inventive concept. Referring to FIGS. 1 and 11, the chip 120-1 is bonded to the top surface of the PCB 100 in operation S110. Referring to FIGS. 2 and 11, the mold 130 is molded to the chip 120-1 and PCB 100 so as to cover the sides of the chip 120-1 but expose the backside surface 123 of the chip 120-1, in operation S112.

Referring to FIGS. 3 and 11, the via openings are formed in the mold 130 to expose the first contacts 110 and a marking process is performed, in operation S114. The marking process includes inscribing at least one first marking in the marking region MR of the top surface of the mold 130. The marking process may additionally include inscribing at least one pair of recognition marks MK1 and MK2 and/or MK3 and MK4 in the marking region MR.

The at least one pair of recognition marks MK1 and MK2 or MK3 and MK4 can be used to align the semiconductor bottom package BP and the semiconductor package 153, e.g., the top package. In particular, a PRS is able to stack the semiconductor package 153 on the unit semiconductor package BP in exact alignment using the at recognition marks MK1 and MK2 and/or MK3 and MK4.

Referring to FIGS. 6 and 11, the contacts (e.g., solder balls) 140 are bonded to (or formed on) the bottom surface of the PCB 110 in operation S116 and the PCB 110 is cut to produce the semiconductor bottom package BP in operation S118. The chip 120-1 of the semiconductor bottom package BP is tested in operation S120. Referring to FIGS. 8, 9, and 11, the semiconductor package 153 is stacked on the semiconductor bottom package BP, and the contacts (e.g., stack vias 161) are formed, to complete the PoP 200 in operation S122.

As described above, according to embodiments of the inventive concept, marking providing product information is inscribed in a surface of a mold (e.g., in an eMUF surface between the backside surface of the chip and stack vias) in a PoP such that the marking is highly visible.

While the inventive concept has been described in detail with reference to exemplary embodiments thereof, it will be understood by those of ordinary skill in the art that various changes in form and details may be made to these embodiments without departing from the spirit and scope of the inventive concept as defined by the following claims.

What is claimed is:

1. A semiconductor device package comprising:
    a printed circuit board (PCB) having an upper surface;
    a chip bonded to the PCB, the chip having an active surface facing the upper surface of the PCB and a backside surface facing away from the upper surface of the PCB;
    first contacts bonded to the PCB at the upper surface of the PCB;
    a mold molded to the PCB at the upper surface thereof, protecting sides of the chip and exposing the backside surface of the chip,
    the mold having a top surface and via openings extending therein, the via openings exposing the first contacts bonded to the PCB; and
    at least one first marking inscribed in the top surface of the mold within a marking region,
    wherein the marking region is a region of the top surface of the mold located between the backside surface of the chip and the via openings, and
    the at least one first marking contains information about the chip.

2. The package of claim 1, wherein the mold has an exposed molded underfill (eMUF) structure covering all of the sides of the chip and exposing the backside surface of the chip.

3. The package of claim 1, wherein the distance from the upper surface of the PCB to the top surface of the mold is the same as the distance from the upper surface of the PCB to the backside surface of the chip.

4. The package of claim 1, wherein the at least one first marking is laser-etched in within the marking region and the via openings are laser-drilled openings.

5. The package of claim 1, wherein the backside surface has the shape of a quadrilateral, and further comprising recognition marks in the marking region lying along an axis coinciding with a diagonal of the backside surface.

6. The package of claim 1, wherein the backside surface of the chip is polygonal, and the marking region of the top surface of the mold is interposed between at least one of the sides of the polygonal backside surface and the via openings.

7. The package of claim 1, further comprising a second marking on the backside surface of the chip.

8. A package on package (PoP), comprising:
    a bottom semiconductor package including a printed circuit board (PCB) having an upper surface,
    a chip bonded to the PCB, the chip having an active surface facing the upper surface of the PCB and a backside surface facing away from the upper surface of the PCB,
    a mold molded to the PCB at the upper surface thereof, protecting the sides of the chip and exposing the backside surface of the chip,
    the mold having a top surface and via openings extending therein, and
    at least one first marking inscribed in the top surface of the mold within a marking region,
    wherein the marking region is a region of the top surface of the mold located between the backside surface of the chip and the via openings, and
    the at least one first marking contains information about the chip;
    a top semiconductor package stacked on the bottom semiconductor package and including a substrate and a chip mounted to the substrate; and
    electrical contacts disposed in the via openings, respectively, and electrically connecting the bottom semiconductor package and the top semiconductor package.

9. The package on package (PoP) as claimed in claim 8, wherein the chip of the bottom semiconductor package comprises one of an application processor and a system on chip, and the top semiconductor package comprises one of a dynamic random access memory (DRAM), NAND flash memory including a controller, NOR flash memory, static RAM (SRAM), ferroelectric RAM (FRAM), phase-change RAM (PRAM), and magnetoresistive RAM (MRAM).

10. The package on package of claim 8, wherein the mold has an exposed molded underfill (eMUF) structure covering all of the sides of the chip of the bottom semiconductor package except for the backside surface and exposing the backside surface of the chip of the bottom semiconductor package.

11. The package on package of claim 8, wherein the distance from the upper surface of the PCB to the top surface of the mold of the bottom semiconductor package is the same as the distance from the upper surface of the PCB to the backside surface of the chip of the bottom semiconductor package.

12. A semiconductor device package, comprising:
    a bottom semiconductor package including a printed circuit board (PCB) having an upper surface,
    a die disposed on the upper surface of the PCB, the die having an active surface facing the upper surface of the PCB,
    conductive bumps disposed on the upper surface of the PCB and electrically connecting the PCB to the die at the active surface of the die,
    a mold layer molded to the PCB at the upper surface thereof, and the mold layer having a top surface, and via openings extending therein and open at the top surface, the top surface of the mold layer including a marking region located in a region of the PoP between the outer periphery of the die and the via openings;

the marking region of the top surface of the molding layer exhibiting at least one first marking containing information about the PoP;

a top semiconductor package stacked on the bottom semiconductor package and including a substrate and a chip mounted to the substrate; and electrical contacts disposed in the via openings, respectively, and electrically connecting the PCB of the bottom semiconductor package and the top semiconductor package.

13. The package on package of claim 12, wherein the bottom semiconductor package includes a first chip comprising the die, the chip having a backside surface facing away from the upper surface of the PCB, and the mold has an exposed molded underfill (eMUF) structure covering all of the sides of the first chip and exposing the backside surface of the first chip.

14. The package on package of claim 12, wherein the distance from the upper surface of the PCB to a top surface of the mold layer is the same as the distance from the upper surface of the PCB to the backside surface of the first chip.

15. The package on package of claim 12, wherein the electrical contacts extend between the PCB of the bottom semiconductor package and the substrate of the top semiconductor package.

16. A computing system comprising:
a board;
a package on package (PoP) mounted to the board; and
a display connected to the PoP through the board,
wherein the PoP comprises:
a bottom semiconductor package including a printed circuit board (PCB) having an upper surface,
a chip bonded to the PCB, the chip having an active surface facing the upper surface of the PCB and a backside surface facing away from the PCB,
a mold molded to the PCB at the upper surface thereof, protecting sides of the chip and exposing the backside surface of the chip,
the mold having via openings extending therein, and
at least one first marking inscribed in a marking region of the mold located between the backside surface of the chip and the via openings;
a top semiconductor package stacked on the bottom semiconductor package and including a substrate and a chip mounted to the substrate; and
electrical contacts disposed in the via openings, respectively, and electrically connecting the bottom semiconductor package and the top semiconductor package.

17. The computing system of claim 16, wherein the mold of the bottom semiconductor package of the PoP has an exposed molded underfill (eMUF) structure exposing the backside surface of the chip of the bottom semiconductor package.

18. The computing system of claim 16, wherein the distance from the upper surface of the PCB to a top surface of the mold of the bottom semiconductor package of the PoP is the same as the distance from the upper surface of the PCB to the backside surface of the chip of the bottom semiconductor package.

19. The computing system of claim 16, wherein the at least one first marking of the PoP is laser-etched in the marking region of the mold of the bottom semiconductor package and the via openings are laser-drilled openings.

20. The computing system of claim 16, wherein the backside surface of the chip of the bottom semiconductor package of the PoP has the shape of a quadrilateral, and further comprising recognition marks in the marking region lying along an axis coinciding with a diagonal of the backside surface of the chip of the bottom semiconductor package.

* * * * *